United States Patent
Wei et al.

(10) Patent No.: US 7,855,604 B1
(45) Date of Patent: *Dec. 21, 2010

(54) PROTECTION CIRCUIT AND METHOD FOR RF POWER AMPLIFIERS IN WLAN TRANSCEIVERS

(75) Inventors: Shuran Wei, San Jose, CA (US); Lawrence Tse, Fremont, CA (US); Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 14 days.

This patent is subject to a terminal disclaimer.

(21) Appl. No.: 12/351,040

(22) Filed: Jan. 9, 2009

Related U.S. Application Data

(63) Continuation of application No. 10/839,679, filed on May 4, 2004, now Pat. No. 7,477,107, which is a continuation of application No. 10/246,870, filed on Sep. 19, 2002, now Pat. No. 6,856,200.

(51) Int. Cl.
*H03F 1/52* (2006.01)

(52) U.S. Cl. .................................. 330/298; 330/207 P

(58) Field of Classification Search .............. 330/207 P, 330/298, 279, 285
See application file for complete search history.

(56) References Cited

U.S. PATENT DOCUMENTS

| | | | |
|---|---|---|---|
| 4,859,967 A | 8/1989 | Swanson | |
| 4,864,251 A | 9/1989 | Baur | |
| 5,070,309 A | 12/1991 | Swanson | |
| 5,081,425 A | 1/1992 | Jackson et al. | |
| 5,196,808 A | 3/1993 | Pickett et al. | |
| 5,905,617 A | 5/1999 | Kawasoe | |
| 6,137,366 A | 10/2000 | King | |
| 6,151,354 A | 11/2000 | Abbey | |
| 6,298,223 B1 * | 10/2001 | Seow | 330/298 |
| 6,466,772 B1 | 10/2002 | Rozenblit et al. | |
| 6,525,611 B1 | 2/2003 | Dening et al. | |
| 6,856,200 B1 | 2/2005 | Wei et al. | |

* cited by examiner

*Primary Examiner*—Khanh V Nguyen

(57) ABSTRACT

A transmitter system includes a transmitter with a power amplifier. An antenna communicates with the power amplifier. A protection circuit generates a sensed signal that varies with an impedance of the antenna and reduces an output of the power amplifier in response to the sensed signal exceeding a predetermined threshold.

10 Claims, 6 Drawing Sheets

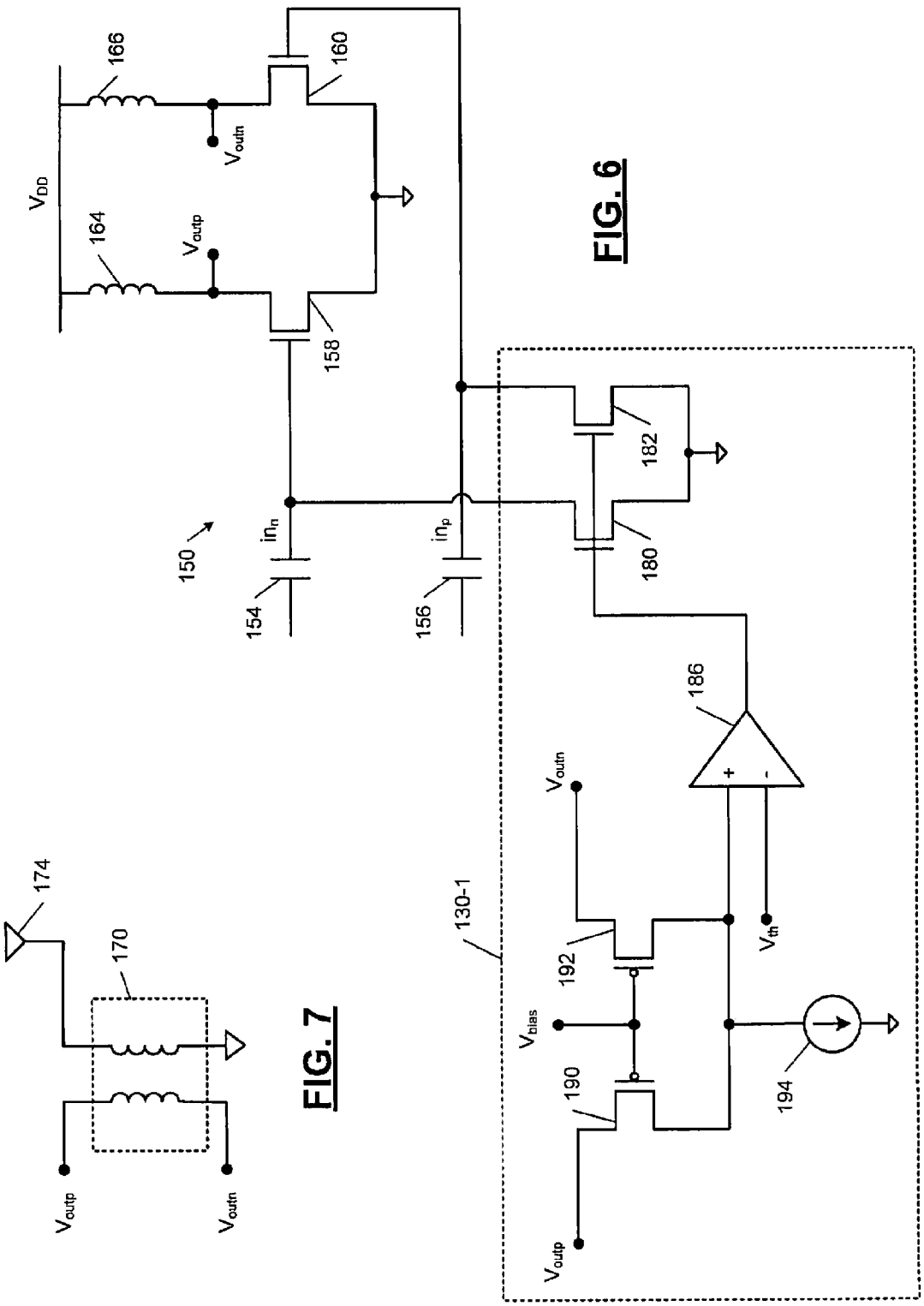

PROTECTION CIRCUIT AND METHOD FOR RF POWER AMPLIFIERS IN WLAN TRANSCEIVERS

CROSS-REFERENCE TO RELATED APPLICATIONS

This application is a continuation of U.S. patent application Ser. No. 10/839,679 filed May 4, 2004, which is a continuation of U.S. patent application Ser. No. 10/246,870, filed Sep. 19, 2002 (now U.S. Pat. No. 6,856,200). The disclosures of the above applications are incorporated herein by reference in their entirety.

FIELD OF THE INVENTION

The present invention relates to power amplifiers, and more particularly to a protection circuit and method for a radio frequency (RF) power amplifier implemented a wireless local area network (WLAN) transceiver.

BACKGROUND OF THE INVENTION

Referring now to FIG. 1, a wireless transceiver 10 is shown and includes a transmitter 12 and a receiver 14. The wireless transceiver 10 may be used in a local area network (LAN) and may be attached to a Baseband Processor (BBP) and a Media Access Controller (MAC) in either a station or an Access Point (AP) configuration. A network interface card (NIC) is one of the various "STATION" configurations. The NIC can be connected to a networked device 16 such as a laptop computer, a personal digital assistant (PDA) or any other networked device. When the transceiver 10 is attached to an access point (AP) MAC, an AP is created. The AP provides network access for WLAN stations that are associated with the transceiver 10.

The wireless transceiver 10 transmits and receives frames/packets and provides communication between two networked devices. In AdHoc mode, the two devices can be two laptop/personal computers. In infrastructure mode, the two devices can be a laptop/personal computer and an AP.

There are multiple different ways of implementing the transmitter 12 and the receiver 14. For purposes of illustration, simplified block diagrams of super-heterodyne and direct conversion transmitter and receiver architectures will be discussed, although other architectures may be used. Referring now to FIG. 2A, an exemplary super-heterodyne receiver 14-1 is shown. The receiver 14-1 includes an antenna 19 that is coupled to an optional RF filter 20 and a low noise amplifier 22. An output of the amplifier 22 is coupled to a first input of a mixer 24. A second input of the mixer 24 is connected to an oscillator 25, which provides a reference frequency. The mixer 24 converts radio frequency (RF) signals to intermediate frequency (IF) signals.

An output of the mixer 24 is connected to an optional IF filter 26, which has an output that is coupled to an automatic gain control amplifier (AGCA) 32. An output of the AGCA 32 is coupled to first inputs of mixers 40 and 41. A second input of the mixer 41 is coupled to an oscillator 42, which provides a reference frequency. A second input of the mixer 40 is connected to the oscillator 42 through a −90° phase shifter 43. The mixers 40 and 41 convert the IF signals to baseband (BB) signals. Outputs of the mixers 40 and 41 are coupled to BB circuits 44-1 and 44-2, respectively. The BB circuits 44-1 and 44-2 may include low pass filters (LPF) 45-1 and 45-2 and gain blocks 46-1 and 46-2, respectively, although other BB circuits may be used. Mixer 40 generates an in-phase (I) signal, which is output to a BB processor 47. The mixer 41 generates a quadrature-phase (Q) signal, which is output to the BB processor 47.

Referring now to FIG. 2B, an exemplary direct receiver 14-2 is shown. The receiver 14-2 includes the antenna 19 that is coupled the optional RF filter 20 and to the low noise amplifier 22. An output of the low noise amplifier 22 is coupled to first inputs of RF to BB mixers 48 and 50. A second input of the mixer 50 is connected to oscillator 51, which provides a reference frequency. A second input of the mixer 48 is connected to the oscillator 51 through a −90° phase shifter 52. The mixer 48 outputs the I-signal to the BB circuit 44-1, which may include the LPF 45-1 and the gain block 46-1. An output of the BB circuit 44-1 is input to the BB processor 47. Similarly, the mixer 50 outputs the Q signal to the BB circuit 44-2, which may include the LPF 45-2 and the gain block 46-2. An output of the BB circuit 44-2 is output to the BB processor 47.

Referring now to FIG. 3A, an exemplary super-heterodyne transmitter 12-1 is shown. The transmitter 12-1 receives an I signal from the BB processor 47. The I signal is input to a LPF 60 that is coupled to a first input of a BB to IF mixer 64. A Q signal of the BB processor 47 is input to a LPF 68 that is coupled to a first input of a BB to IF mixer 72. The mixer 72 has a second input that is coupled to an oscillator 74, which provides a reference frequency. The mixer 64 has a second input that is coupled to the oscillator through a −90° phase shifter 75.

Outputs of the mixers 64 and 72 are input to a summer 76. The summer 76 combines the signals into a complex signal that is input to a variable gain amplifier (VGA) 84. The VGA 84 is coupled to an optional IF filter 85. The optional IF filter 85 is connected to a first input of an IF to RF mixer 86. A second input of the mixer 86 is connected to an oscillator 87, which provides a reference frequency. An output of the mixer 86 is coupled to an optional RF filter 88. The optional RF filter 88 is connected to a power amplifier 89, which may include a driver. The power amplifier 89 drives an antenna 90 through an optional RF filter 91.

Referring now to FIG. 3B, an exemplary direct transmitter 12-2 is shown. The transmitter 12-2 receives an I signal from the BB processor 47. The I signal is input to the LPF 60, which has an output that is coupled to a first input of a BB to RF mixer 92. A Q signal of the BB processor 47 is input to the LPF 68, which is coupled to a first input of a BB to RF mixer 93. The mixer 93 has a second input that is coupled to an oscillator 94, which provides a reference frequency. The mixer 92 has a second input that is connected to the oscillator 94 through a −90° phase shifter 95. Outputs of the mixers 92 and 93 are input to the summer 76. The summer 76 combines the signals into a complex signal that is input the power amplifier 89. The power amplifier 89 drives the antenna 90 through the optional RF filter 91. The RF and IF filters in FIGS. 2A, 2B, 3A and 3B may be implemented on-chip or externally.

The power amplifier drives current to create magnetic fields that propagate from the antenna. Typically, the impedance of the antenna has a specific value for the operating frequency of the power amplifier. For example, a WLAN transmitter operating at 2.4 GHz typically has a 50Ω antenna. When the impedance of the antenna changes, the voltage across one or more transistors in the power amplifier may substantially increase. If the voltage exceeds a breakdown voltage of the output transistor, then the transistor may be damaged.

For example, the impedance of the antenna changes when users inadvertently handle the antenna or when the antenna contacts other objects. The impedance of the antenna also varies with the operating frequency of the transmitter. Some conventional transceivers are implemented using transistor technologies (such as GaAs) that have high breakdown voltages. However, the selection of the transistor technology may be based on other design considerations such as cost and the selected transistor technology may not have a high breakdown voltage.

SUMMARY OF THE INVENTION

A protection circuit for a power amplifier of a radio frequency transmitter according to the invention includes a sensing circuit that generates a sensed signal based on an output of the power amplifier. A reference signal generator generates a reference signal. A comparator communicates with the sensing circuit and the reference signal generator and outputs a first state when the reference signal exceeds the sensed signal and a second state when the sensed signal exceeds the reference signal.

In other features, the comparator communicates with the power amplifier and turns off the power amplifier when the comparator is in the second state. The sensing circuit includes first and second transistors having a gate that is biased at a first voltage, sources that communicate with positive and negative outputs of the power amplifier, and drains that communicate with one input of the comparator. A current source communicates with the drains of the first and second transistors.

In yet other features, a turn-off circuit turns the power amplifier off when the comparator is in the second state. The turn-off circuit includes third and fourth transistors that communicate with inputs of the power amplifier. Gates of the third and fourth transistors communicate with the comparator. Alternately, the turn-off circuit includes a fifth transistor that shorts inputs of the power amplifier when the comparator is in the second state.

A radio frequency (RF) wireless local area network (WLAN) transceiver according to the present invention includes a power amplifier that includes a transistor. A protection circuit senses an output voltage of the power amplifier and turns off the power amplifier when the output voltage exceeds a predetermined level to prevent damage to the transistor.

In other features, the protection circuit includes a sensing circuit that generates a sensed signal based on an output voltage of the power amplifier. The protection circuit includes a reference signal generator that generates a reference signal. The protection circuit includes a comparator that communicates with the sensing circuit and the reference signal generator. The comparator outputs a first state when the reference signal exceeds the sensed signal and a second state when the sensed signal exceeds the reference signal. The comparator communicates with the power amplifier and turns off the power amplifier when the comparator is in the second state.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 6 is an electrical schematic of a first exemplary implementation of the power amplifier protection circuit;

FIG. 7 is an electrical schematic showing the antenna coupled to the output stage of the power amplifier.

DETAILED DESCRIPTION OF THE PREFERRED EMBODIMENTS

Figure 1:
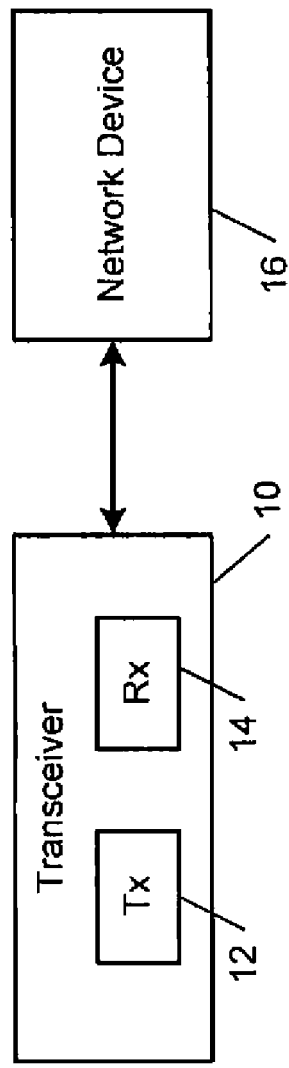
FIG. 1 is a functional block diagram of a wireless local area network (WLAN) transceiver according to the prior art.
Figure 2A:
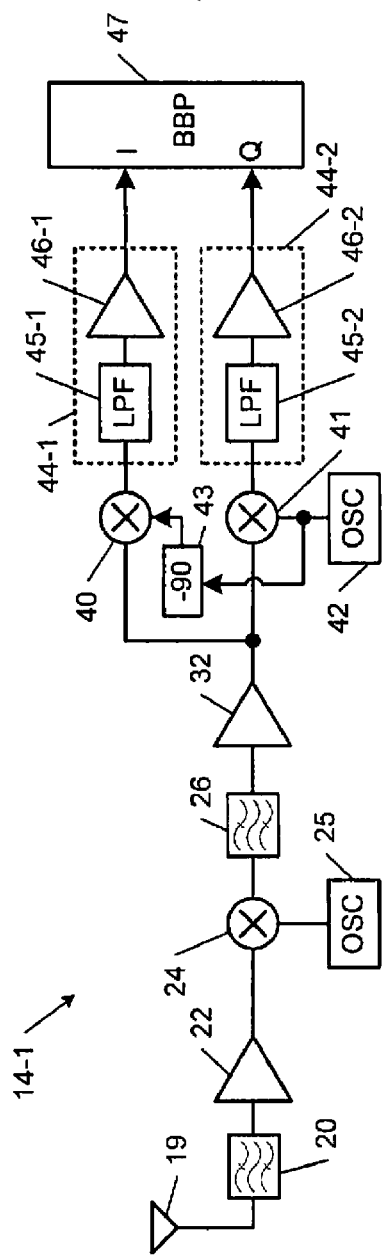
FIG. 2A is a functional block diagram of an exemplary super-heterodyne receiver architecture according to the prior art.
Figure 2B:
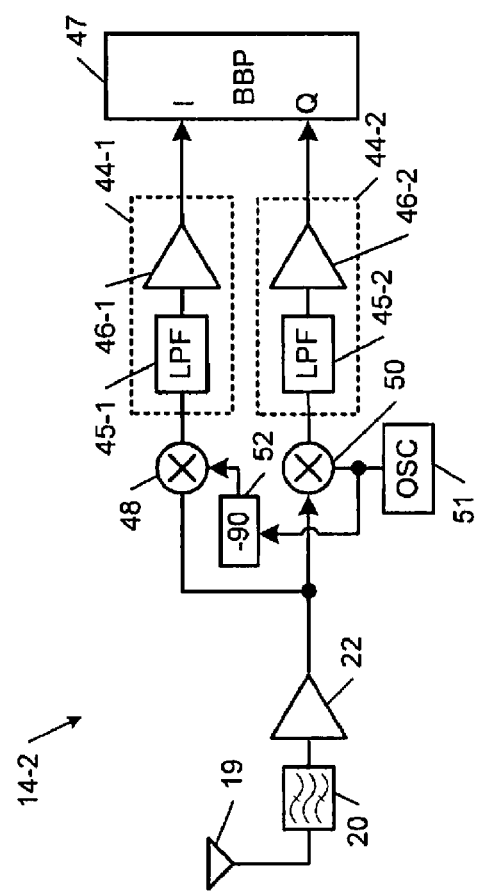
FIG. 2B is a functional block diagram of an exemplary direct receiver architecture according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3A:
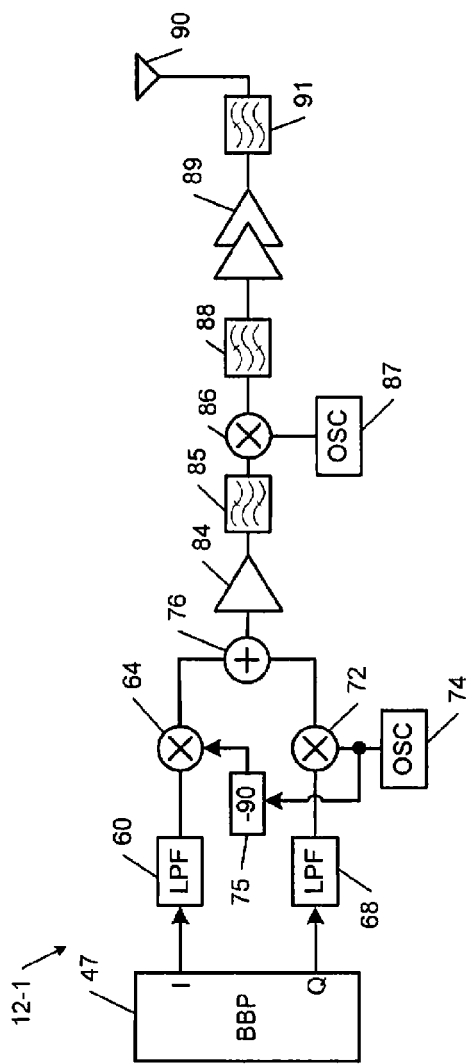
FIG. 3A is a functional block diagram of an exemplary super-heterodyne transmitter architecture according to the prior art.
Figure 3B:
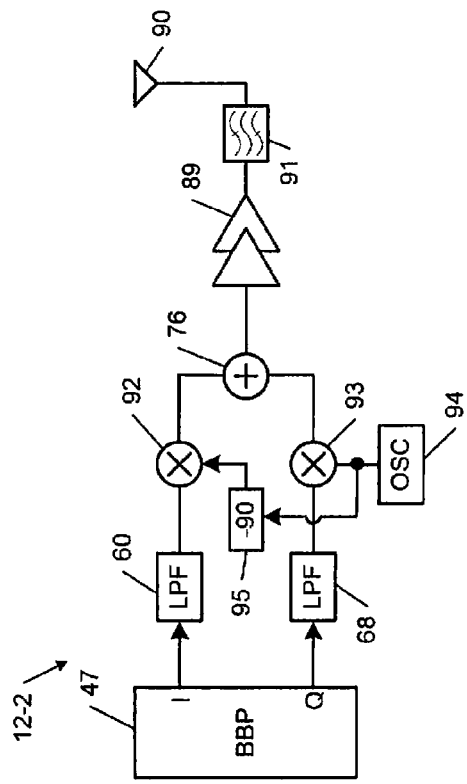
FIG. 3B is a functional block diagram of an exemplary direct transmitter architecture according to the prior art.
Figure 4:
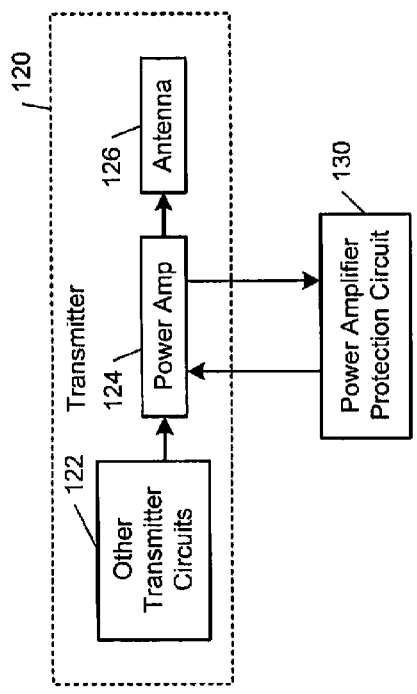
FIG. 4 is a functional block diagram of a radio frequency transmitter and a power amplifier protection circuit according to the present invention.

Referring now to FIG. 4, a transmitter 120 includes transmitter circuits 122 (such as those depicted in FIGS. 3A and 3B), a power amplifier 124, and an antenna 126. A power amplifier protection circuit 130 monitors a voltage output of the power amplifier 124. The power amplifier protection circuit 130 shuts down the power amplifier 124 when the output voltage exceeds a predetermined voltage value to prevent damage to the power amplifier 124. For example, the power amplifier protection circuit 130 prevents damage that may occur when a user or an object touches the antenna 126, alters the impedance of the antenna, and causes a voltage increase.

Figure 5:
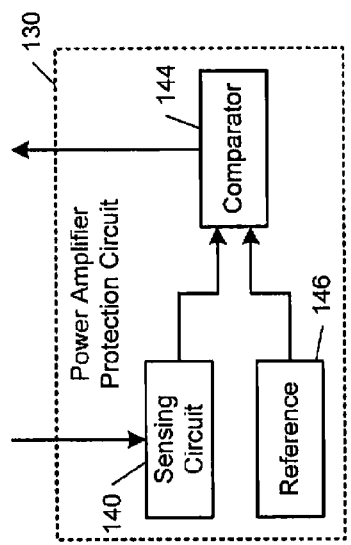
FIG. 5 is a functional block diagram of the power amplifier protection circuit of FIG. 4 in further detail.

Referring now to FIG. 5, the power amplifier protection circuit 130 is illustrated in further detail. The power amplifier protection circuit 130 includes a sensing circuit 140 that senses an output of the power amplifier 124. An output of the sensing circuit 140 is input to a comparator 144. A reference signal generator 146 generates a reference signal. An output of the reference signal generator 146 is also input to the comparator 144. When the output of the sensing circuit 140 exceeds an output of the reference signal generator 146, the comparator 144 changes state and turns off the power amplifier 124.

Referring now to FIG. 6, a first exemplary implementation of the power amplifier protection circuit 130-1 is illustrated. The power amplifier protection circuit 130-1 communicates with an output stage 150 of a power amplifier. The output stage 150 is typically coupled by capacitors 154 and 156 to other transmitter circuits. A negative input $in_n$ is coupled to a gate of a first transistor 158. A positive input $in_p$ is coupled to a gate of a second transistor 160. A first inductor 164 is connected between a voltage source $V_{DD}$ and a drain of the first transistor 158. A second inductor 166 is connected between the voltage source $V_{DD}$ and a drain of the second transistor 160. The sources of the transistors 158 and 160 are coupled to a common potential such as ground. Positive and negative outputs $V_{outp}$ and $V_{outn}$, which drive the antenna, are taken between the inductors 164 and 166 and the drains of the transistors 158 and 160. In FIG. 7, the output stage of the differential power amplifier is typically coupled through an output transformer, which performs differential to single-ended conversion.

The power amplifier protection circuit 130-1 includes first and second transistors 180 and 182 having drains connected to the gate of the transistors 158 and 160, respectively. Gates of the transistors 180 and 182 are connected to an output of a comparator 186. A first input of the comparator 186 is connected to a reference signal $V_{th}$.

The outputs $V_{outp}$ and $V_{outn}$ of the output stage 150 are connected to sources of transistors 190 and 192. Gates of the transistors 190 and 192 are connected to $V_{bias}$. Drains of the transistors 190 and 192 are connected together, to a current source 194, and to a second input of the comparator 186.

In use, the voltage $V_{bias}$ is set above the normal operating voltage of the transistors 158 and 160. Transistors 190 and 192 are off under normal operating conditions with proper signal voltage at the drains of transistors 158 and 160. Since neither transistors 190 and 192 are conducting, current source 194 will pull the second input of the comparator 186 towards ground potential. When the operating voltage exceeds $V_{bias}$, the transistors 190 and 192 begin conducting. The non-inverting input exceeds the threshold voltage of the comparator 186 and the comparator 186 changes state. The comparator 186 biases the gates of the transistors 180 and 182, which begin conducting. The inputs to the output stage 150 of the power amplifier are shorted to ground and the power amplifier is turned off. When the operating voltage falls below the $V_{bias}$, the transistors 190 and 192 stop conducting and the comparator 186 changes state. The comparator 186 turns off the transistors 180 and 182 and normal operation of the power amplifier can be resumed if the effective impedance of the antenna returns to nominal range.

Figure 8:
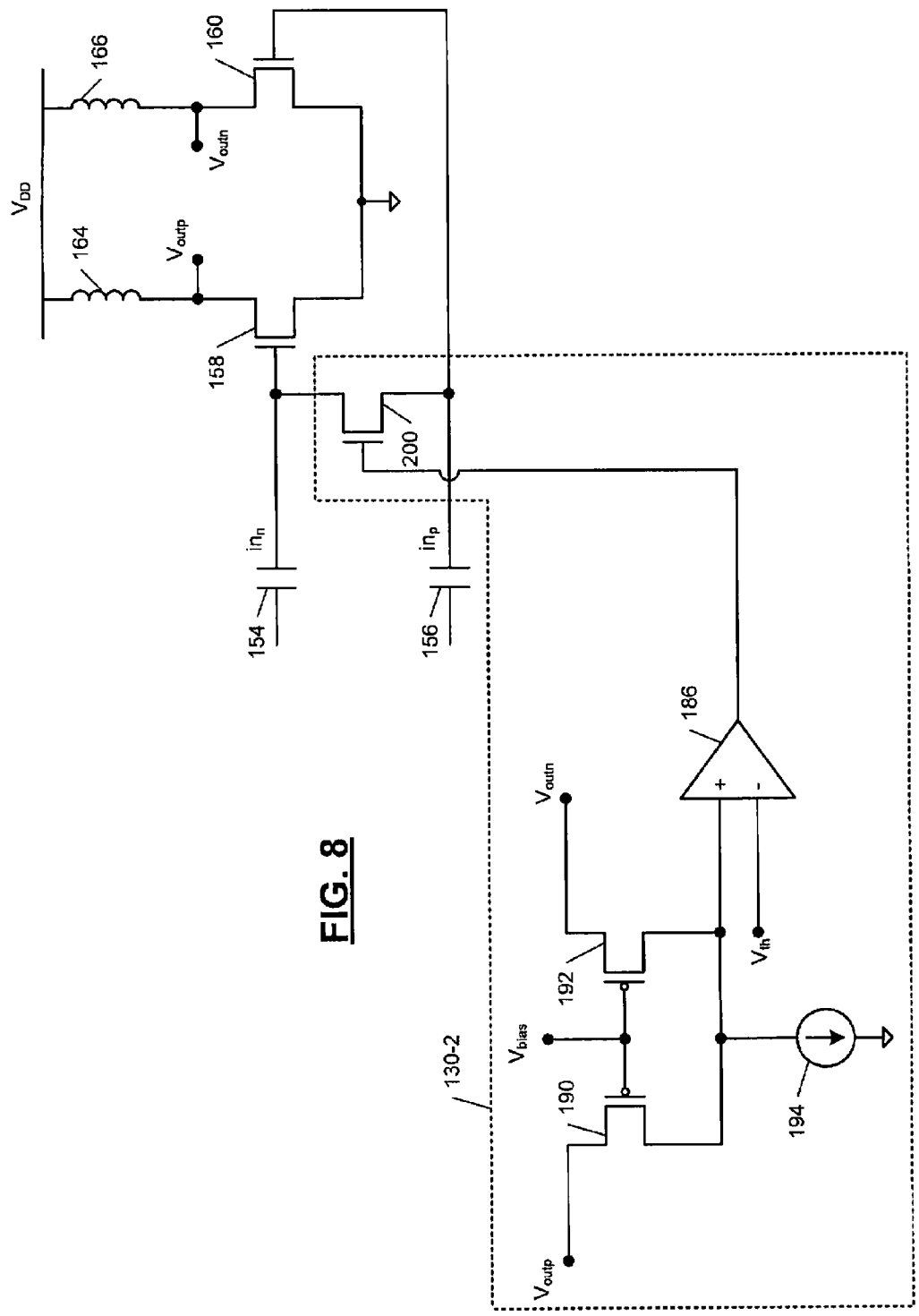
FIG. 8 is an electrical schematic of a second exemplary implementation of the power amplifier protection circuit.

Referring now to FIG. 8, a second exemplary implementation of the power amplifier protection circuit is illustrated at 130-2. The transistors 180 and 182 are replaced by a transistor 200. The transistor 200 shorts the gates of the transistors 158 and 160 when the comparator 186 changes state when the second signal exceeds the reference signal. This will suppress the AC signals applied to the PA and reduce signal swing at PA outputs, which prevents transistor breakdown or overstress.

In the exemplary implementations in FIGS. 6 and 8, CMOS technology is employed. Transistors 158, 160, 180, 182 and 200 are implemented using n-channel CMOS transistors. Transistors 190 and 192 have been implemented using p-channel CMOS transistors. Skilled artisans will appreciate that the present invention has application to other transistor technologies having low breakdown voltages and that these other transistor technologies may be employed without departing from the scope of the present invention.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A transmitter system, comprising:
   a transmitter including a power amplifier;
   an antenna to communicate with the power amplifier; and
   a protection circuit to
      generate a sensed signal that varies with an impedance of the antenna, and
      reduce an output of the power amplifier in response to the sensed signal exceeding a predetermined threshold,
   wherein the protection circuit comprises:
      a sensing circuit to generate the sensed signal;
      a reference signal generator to generate the predetermined threshold; and
      a comparator to
         output a first state in response to the predetermined threshold exceeding the sensed signal; and
         output a second state in response to the sensed signal exceeding the predetermined threshold.

2. The transmitter system of claim 1, wherein the comparator shorts an input of the power amplifier in response to the comparator outputting the second state.

3. The transmitter system of claim 1, wherein the comparator turns off the power amplifier in response to the comparator outputting the second state.

4. The transmitter system of claim 1, wherein:
   the power amplifier includes a transistor; and
   the comparator communicates with a control terminal of the transistor.

5. A transmitter system, comprising:
   a transmitter including a power amplifier;
   a sensing circuit to sense an increase in impedance of an antenna that communicates with the power amplifier; and
   a turn-off circuit to reduce an output of the power amplifier in response to the increase in the impedance of the antenna exceeding a predetermined threshold,
   wherein the sensing circuit generates a sensed signal that varies with the impedance of the antenna,
   wherein the turn-off circuit comprises a comparator, and
   wherein the comparator (i) outputs a first state in response to the predetermined threshold exceeding the sensed signal and (ii) outputs a second state in response to the sensed signal exceeding the predetermined threshold.

6. The transmitter system of claim 5, wherein:
   the turn-off circuit includes a first transistor and a second transistor, wherein each of the first transistor and the second transistor communicates with the power amplifier; and
   a control terminal of the first transistor and a control terminal of the second transistor communicate with the comparator.

7. The transmitter system of claim 5, wherein the turn-off circuit includes a first transistor to short an input of the power amplifier in response to the comparator outputting the second state.

8. A method, comprising:
   generating a sensed signal that varies with an impedance of an antenna of a transmitter;
   reducing an output of a power amplifier of the transmitter in response to the sensed signal exceeding a predetermined threshold;
   outputting a first state in response to the predetermined threshold exceeding the sensed signal; and
   outputting a second state in response to the sensed signal exceeding the predetermined threshold.

9. The method of claim 8, further comprising shorting an input of the power amplifier in response to the second state being output.

10. The method of claim 8, further comprising turning off the power amplifier in response to the second state being output.

* * * * *